US007638383B2

(12) United States Patent
Jin et al.

(10) Patent No.: US 7,638,383 B2
(45) Date of Patent: Dec. 29, 2009

(54) FACETED CATALYTIC DOTS FOR DIRECTED NANOTUBE GROWTH

(75) Inventors: Been-Yih Jin, Lake Oswego, OR (US); Robert S. Chau, Beaverton, OR (US); Brian S. Doyle, Portland, OR (US); Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 345 days.

(21) Appl. No.: 11/524,067

(22) Filed: Sep. 19, 2006

(65) Prior Publication Data

US 2009/0289245 A1    Nov. 26, 2009

(51) Int. Cl.
*H01L 21/336* (2006.01)
*H01L 21/8234* (2006.01)
(52) U.S. Cl. .............. 438/197; 438/585; 257/288; 257/616; 257/E51.04; 977/720; 977/721; 977/742; 977/858; 977/859
(58) Field of Classification Search ................ 438/197; 977/721, 720, 742, 858, 859; 257/288, 616, 257/E51.04
See application file for complete search history.

(56) References Cited

U.S. PATENT DOCUMENTS

| 7,098,056 | B2 * | 8/2006 | Demers ................ 438/20 |
| 2003/0197120 | A1 * | 10/2003 | Miyamoto ............ 250/234 |
| 2004/0101469 | A1 * | 5/2004 | Demers ................ 423/447.3 |
| 2004/0127130 | A1 * | 7/2004 | Yi et al. ............... 442/376 |
| 2006/0022221 | A1 * | 2/2006 | Furukawa et al. ..... 257/222 |
| 2007/0014151 | A1 * | 1/2007 | Zhang et al. .......... 365/185.01 |
| 2008/0032238 | A1 * | 2/2008 | Lu et al. .............. 430/322 |

* cited by examiner

*Primary Examiner*—Zandra Smith
*Assistant Examiner*—Jeremy J Joy
(74) *Attorney, Agent, or Firm*—Blakely, Sokoloff, Taylor & Zafman LLP

(57) ABSTRACT

Faceted catalytic dots are used for directing the growth of carbon nanotubes. In one example, a faceted dot is formed on a substrate for a microelectronic device. A growth promoting dopant is applied to a facet of the dot using an angled implant, and a carbon nanotube is grown on the doped facet of the dot.

18 Claims, 6 Drawing Sheets

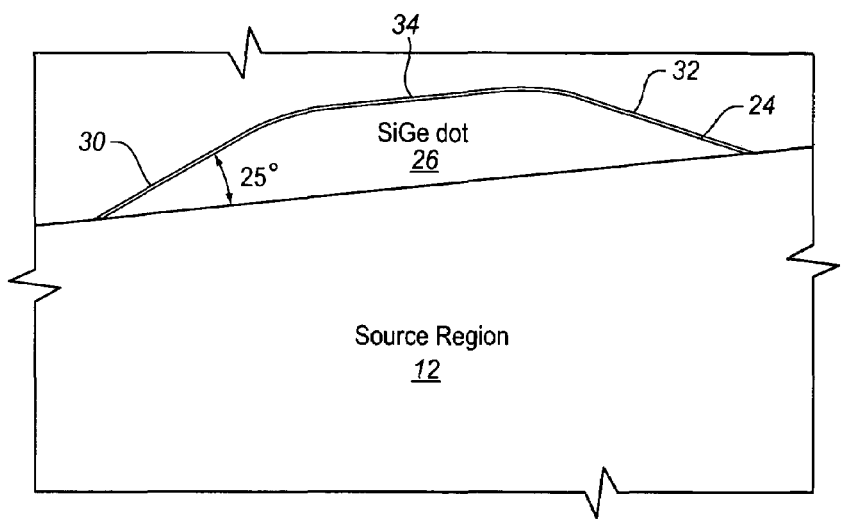
FIG. 7
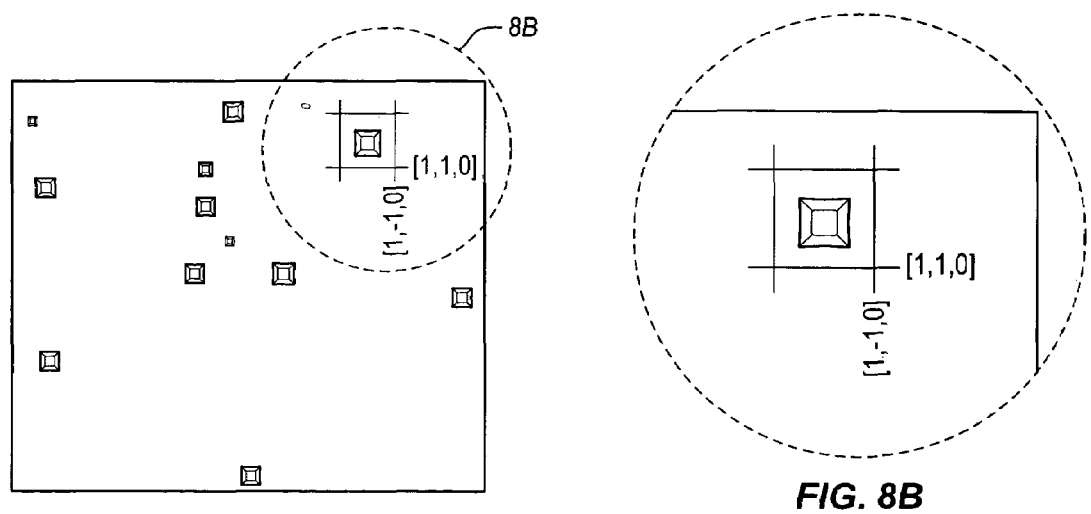
FIG. 8A
FIG. 8B

US 7,638,383 B2

FACETED CATALYTIC DOTS FOR DIRECTED NANOTUBE GROWTH

BACKGROUND

1. Field

Directed carbon nanotube growth is described, and in particular growing carbon nanotubes with a well-controlled direction, orientation and size.

2. Related Art

Carbon nanotubes (CNT) have been investigated for a wide range of possible applications. However, at present, it remains difficult to control the size of CNT, both in diameter and length. Size is an important factor in the electrical properties as well as the mechanical properties of the device. It is also difficult to control the chirality of a CNT which affect the CNT's transport properties. The placement and orientation of a CNT is also not well controlled. Without a way to reliably and inexpensively control the size, distribution, and growth direction of nanotubes to within a few nanometers, their applications are limited.

One such application is in making discrete CNT transistors. Prototype transistors have been shown to exhibit a variety of promising transport properties. Field effect transistors (FET) made with CNTs have shown very high thermal conductivity, high current conduction, and very high gain compared with silicon devices. However, these prototypes cannot yet be manufactured with the cost, precision, and reliability of conventional technologies, such as mature silicon based CMOS (complementary metal oxide semiconductor) technology.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

FIG. 7 is a more detailed cross-sectional diagram of the pyramidal dot of FIG. 6 according to an embodiment of the invention;

FIG. 8A is a top elevation diagram of a grouping of pyramidal dots aligned with the crystalline structure of the wafer according to an embodiment of the invention;

FIG. 8B is close-up of a portion of the top elevation diagram of FIG. 8A;

DETAILED DESCRIPTION

Carbon nanotubes may be grown with precision in size, placement and direction using facets of catalysis-cladded, self-assembled SiGe/Ge dots. The wetting capability of Ge or SiGe alloys (Ostwald ripening) may be used to carry and self assemble a thin catalytic capping layer on the dots. The capping layer then forms pyramidal catalytic islands. Growth inhibitor and growth promoter layers may be applied to the catalyst using tilted and twisted low energy high dose implants. Carbon nanotubes may then be grown on the growth promoter sections. Photolithography and isolation may then be used to define the positions of the catalytic islands as well as their size and orientation. Photolithography, printing and other techniques may then be used to define source, drain, and isolation areas.

This self assembling property of materials, such as the low melting point group IV materials (Ge or Si1−xGex alloys) may be used to form faceted catalytic dots with facets aligned to axes of the dots' crystalline structure. This allows catalytical islands to be formed with good control of the size. It also allows facets to be formed on the islands with a defined orientation and self-aligned to the substrate on which they are formed. Angled and tilted growth inhibiting and growth promotion implants on selected facets enable the precise control of the size, position and growth direction of carbon nanotubes.

Figure 1A:
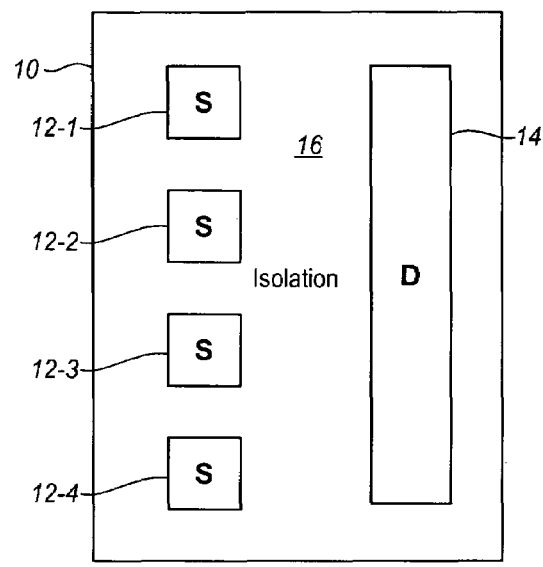
FIG. 1A is a diagram of a portion of a silicon substrate showing sources and a drain according to an embodiment of the invention.

The drawing figures show in a diagram form a sequence of operations that may be used to grow precisely controlled carbon nanotubes and to form transistors, in this case FETs using the nanotubes. In FIG. 1A, sources and a drain are defined on a silicon substrate 10. While the described example is in the context of a silicon substrate, a variety of other material may be used with appropriate modifications, such as gallium arsenide, lithium niobate and ceramics.

Figure 1B:
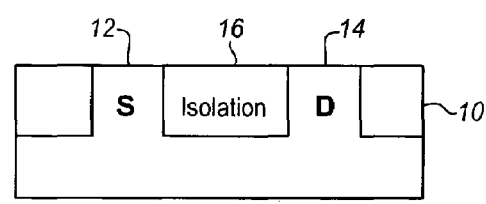
FIG. 1B is a diagram of a portion of a silicon substrate showing sources and a drain according to an embodiment of the invention.

In this particular example, as shown in FIG. 1A, a group of square source areas 12-1, 12-2, 12-3, 12-4 and a rectangular drain area 14 are defined on a substrate or die 10 through lithography and isolation processes. An isolation area 16 is formed between the source areas and the drain area. Any of a variety of different processes may be used to define these areas. The source and drain may be formed of silicon, or any other material upon which Ge, or a similar material, may be epitaxially grown, such as GaAs. The size of the source area may be designed based on product need. The size of the source, together with the Ge wetting layer thickness, will determine the final catalytic dot size, which may be below 50 nm in diameter. The best dot size will depend upon the particular application. In many applications, the sources may be made in common sizes and the dots simply formed over a conventionally sized source. FIG. 1B shows a cross-sectional side view of the portion of the substrate or die 10 of FIG. 1A through one of the sources 12 and the drain 14 with the isolation area 16 in between.

Figure 2:
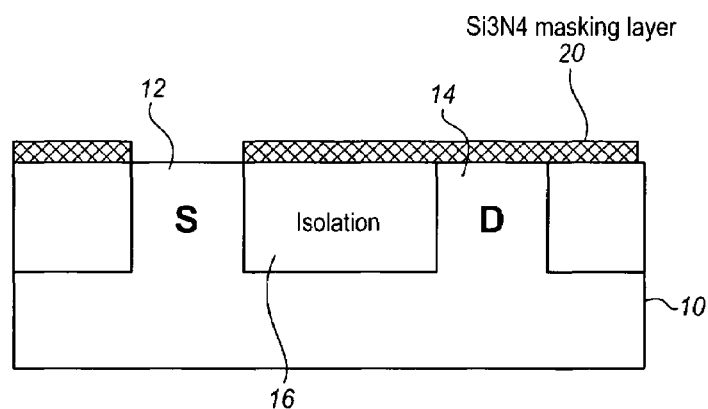
FIG. 2 is a diagram of the portion of the silicon substrate showing the source and drain masked off according to an embodiment of the invention.

In FIG. 2, the drain area and the isolation area 16 between the source and the drain are masked off. The mask layer 20 may be made from any suitable materials, including nitrides, such as $Si_3N_4$ and oxides on which Ge epitaxial growth is severely suppressed. In other words, every area that is not to receive a catalytic island is masked off. Masking techniques allow the positions of the islands to be determined with very high precision. In this example of constructing transistors, the all but the sources are masked off.

Figure 3:
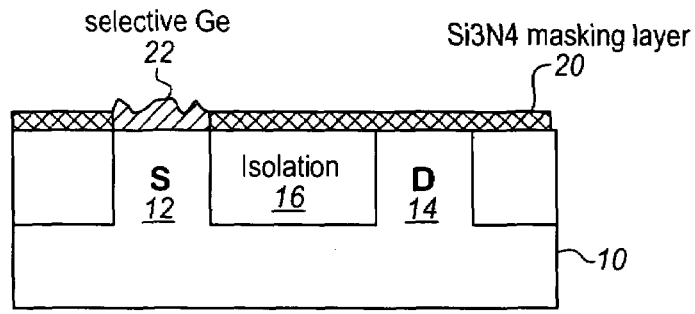
FIG. 3 is a diagram of the portion of the silicon substrate showing a deposited wetting layer according to an embodiment of the invention.

In FIG. 3, a thin layer 22 of Ge or SiGe has been selectively deposited as a wetting layer into the source area. This may be done using, for example, epitaxial methods such as LPCVD (Low Pressure Chemical Vapor Deposition) where Ge or SiGe will preferentially grow on source contacts compared to masked off areas. Alternatively, other low melting point materials may be used (e.g. InSb) provided that they can be selectively grown on the substrate of choice. This layer 22 is applied in order to deposit the wetting layer over the source. The thickness of the Ge layer is designed based on the intended size for the dots after a self assembling anneal, described below. Any other wetting layer may be used for this operation, including Si1-xGex alloys. The particular choice of wetting material will depend upon the particular processes substrates and application.

Figure 4:
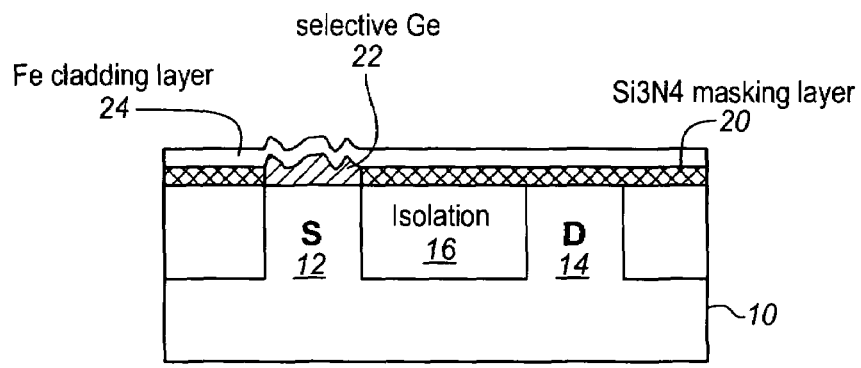
FIG. 4 is a diagram of the portion of the silicon substrate showing a deposited catalytic layer according to an embodiment of the invention.

In FIG. 4, a thin layer 24 of catalytic material, such as Fe, Ni, Co, Y or other transition metals are deposited using sputtering or evaporation techniques over the entire surface 20, 22 of the die and, in particular over the source area 12. The catalytic metal layer acts as a cladding in later processes.

Figure 5:
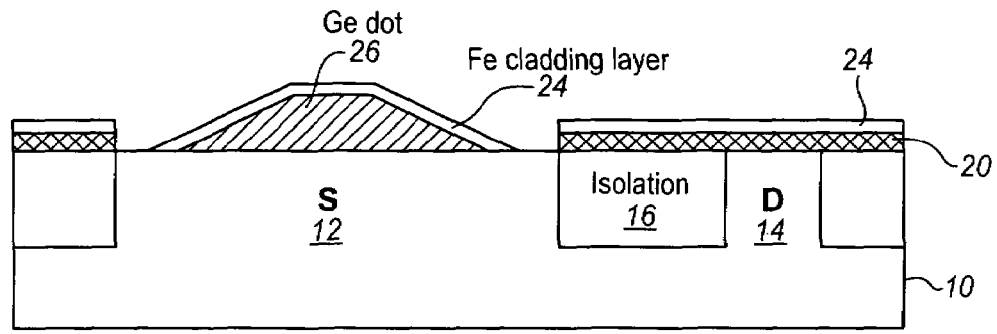
FIG. 5 is a diagram of the portion of the silicon substrate showing a pyramidal dot after annealing according to an embodiment of the invention.

In FIG. 5, the entire wafer is heated up to temperatures in the range for example of 400° C.-600° C. and then cooled back to room temperature. This anneals the multilayer wetting, cladding layer 24 to form self assembled pyramidal dots 26 in the source area with a cladding layer 24 over them.

Figure 6:
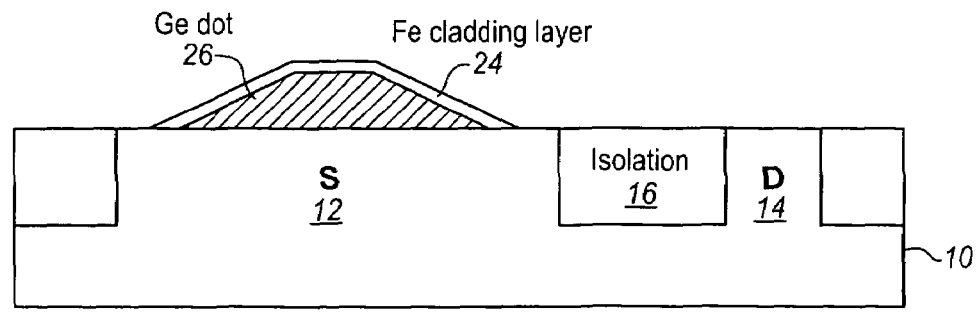
FIG. 6 is a diagram of the portion of the silicon substrate showing the pyramidal dot with masking and catalytic layers removed according to an embodiment of the invention.

In FIG. 6, the $Si_3N_4$ masking layer 20 and the thin catalytic layer 24 that is on top of the masking layer is selectively removed using wet etch of the masking layer. When the catalytic layer is sufficiently thin and porous the wet etch chemicals can penetrate through to attack the masking layer. This leaves the Ge dot 26 with its Fe cladding 24 isolated over the source area 12.

FIG. 7 shows an example of a Ge dot in more detail. FIG. 7 is a diagram based on a TEM (transmission electron microscope) image of a cross-section of an actual Ge dot 26 annealed onto a Si substrate 12. In this particular example, the dot has a width of about 128 nm and sloped sides 32, 34 that extend around the outer circumference of the dot. The self-assembled dots are grown on a [100] Si substrate and the bases of the dots are along [110]. The facets 32, 34 of the dots are therefore on the inclination angle of the bases on [110] to the Si [100] crystalline orientation surface, which is 25 degrees. The sides of the dot are accordingly sloped at about 25 degrees.

Other orientations may be used for different applications and for different materials. For example with another substrate, the bases may be aligned along the [100] axis. The particular slope may be adapted to grow nanotubes in different directions. Process variations may be accommodated by the choice of growth material. Different compositions, such as SiGe, pure Ge and other materials as well as starting orientations of the substrate may be modified to suit different applications. The illustrated dot also has a flat top 34 that may also be used to deposit electrodes, insulation or other structures. The thin catalytic layer formed as a cladding cap 26 over the Ge dots in FIG. 4 remains.

The angled facets of the dots allow different sides of the dots to be treated differently. Different sides and the top may be doped with growth inhibitors and growth promoters so that nanotubes may be grown in any desired position and angle. Nanotubes may also be grown in more than one position on a single dot, depending on the desired connections.

FIG. 8A is a diagram based on an atomic force microscope image of Ge dots. As shown in FIG. 8, the bases of the pyramidal dots are aligned to [110] axes of the underlying Si (100) wafer substrate. This alignment may be used together with the patterning orientation of the source contacts to more precisely control the size of the growth islands.

FIG. 8B is a diagram showing one particular dot in more detail. The same alignment is shown and in this more detailed view, the four bases of the angled facets along the [1,1,0], [1,−1,0], [−1, 1, 0] and [−1,−1,0] directions are visible between the top flat layer and the lower silicon substrate. FIG. 8B may be considered a top elevation view of the dot of FIG. 7. Alternatively, FIG. 7 may be considered a side cross-sectional view of the dot of FIG. 8B. Both diagrams are diagrams intended to be representations of typical dots that are produced and used according to embodiments of the present invention. Accordingly, the dots may vary from those shown in material, shape and relevant axes.

Figure 9:
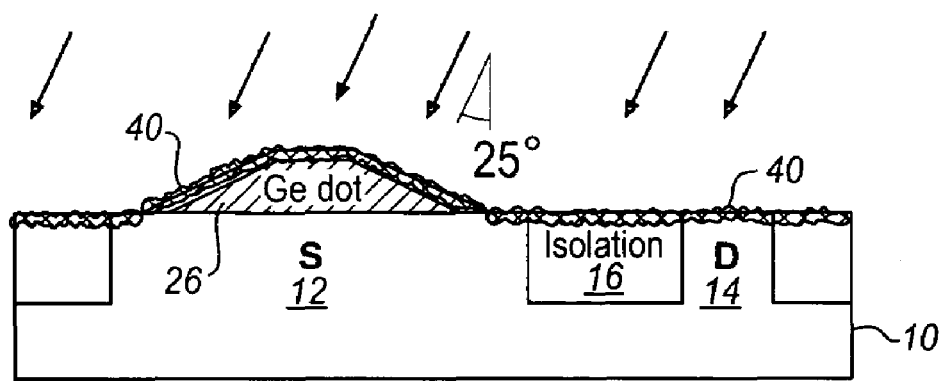
FIG. 9 is a diagram of the portion of the silicon substrate showing doping with a growth promotion agent according to an embodiment of the invention.

FIG. 9 shows, doping a dot (and the rest of the structure) with a growth promotion dopant 40 such as Fe, Ni, Co, Y or any other transition metal. This may be done using an angled implant onto any particular growth facet. In the example of FIG. 9, the dopant is applied for example, at 0° rotation with respect to the horizontal axes of the substrate as shown in FIG. 7, and the [110] axes, and at a tilt of less than 25°. The tilt in this example is expressed as the angle between a normal to the substrate and the dopant application direction.

Figure 10:
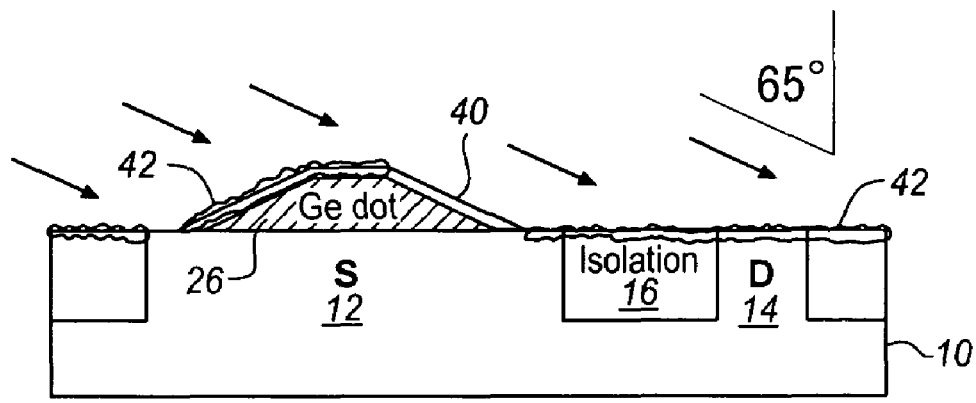
FIG. 10 is a diagram of the portion of the silicon substrate showing doping with a growth inhibiting agent according to an embodiment of the invention.

FIG. 10 shows a complementary operation of introducing a growth inhibiting dopant 42, such as $N_2$, $O_2$ or any other materials that will neutralize the action of the growth promotion metals on the surfaces where carbon nanotubes are not desired. In the example of FIG. 10, the dopant is applied at all right angle rotations other than 0°, e.g. 90°, 180°, and 270° and at a tilt angle of more than 65° to a normal to the substrate. The angled application applies a growth inhibitor on the no-growth facets of the Ge dot as well as on the isolation and drain areas. The direction rotation and the tilt angle may be adjusted so that the growth facet is impartially or completely shadowed. This aids in that the majority of the growth facet will not receive the prohibiting dopant implants. The dopant may be implanted in a process with a low energy (for example 1-5 keV) and a high dose (for example 0.5-2e15). This reduces the amount of dopant that is implanted in areas at which the dopant is not directed.

While in the illustrated example, the growth promotion dopant is applied to all surfaces and the growth inhibiting dopant is applied to the surface upon which no nanotubes are desired, the process may be reversed. In other words, the growth inhibiting dopant may be applied to all surfaces and then the growth promoting dopant applied only to the areas where carbon nanotubes are to be grown. In the present structure, however, this may require a much greater control over the implant process than the suggested processes may offer.

Figure 11:
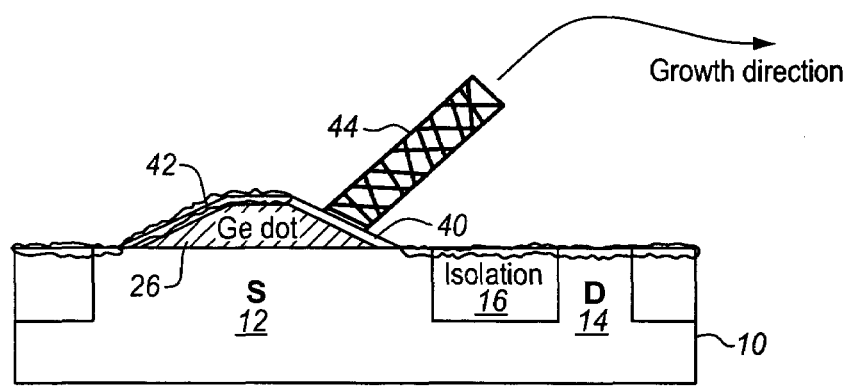
FIG. 11 is a diagram of the portion of the silicon substrate showing the growth of nanotubes according to an embodiment of the invention.

In FIG. 11, nanotubes 44 are grown, using, for example CVD (Chemical Vapor Deposition) on the substrate. Due to the doping, the nanotubes grow only on the selected facet, that is, on the surfaces that have no growth inhibiting dopant and that do have a growth promoting dopant. Nanotubes may also be grown on surfaces that have no dopant or at different rates on different surfaces depending on whether there is a growth promoting dopant, growth inhibiting dopant or no dopant at all. In the illustrated example, all surfaces have either a growth inhibiting dopant covering a growth promoting dopant, or an exposed growth promoting dopant. The carbon nanotubes, accordingly are grown only on the exposed growth promoting dopant.

Figure 12:
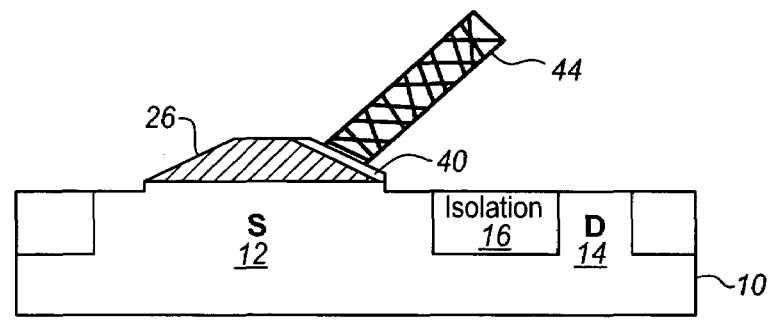
FIG. 12 is a diagram of the portion of the silicon substrate showing the growth inhibiting doped layer removed according to an embodiment of the invention.
Figure 13:
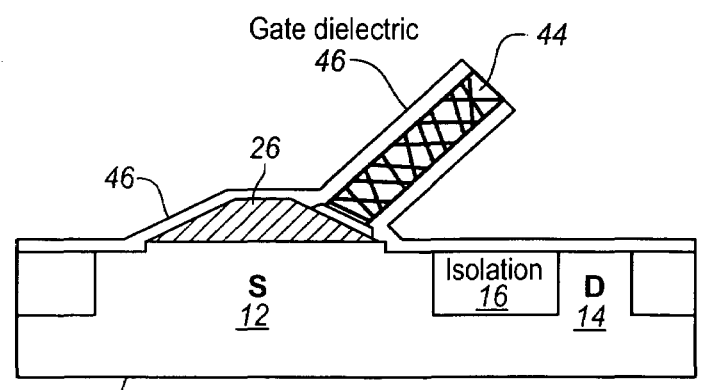
FIG. 13 is a diagram of the portion of the silicon substrate showing deposited gate dielectric according to an embodiment of the invention.
Figure 14:
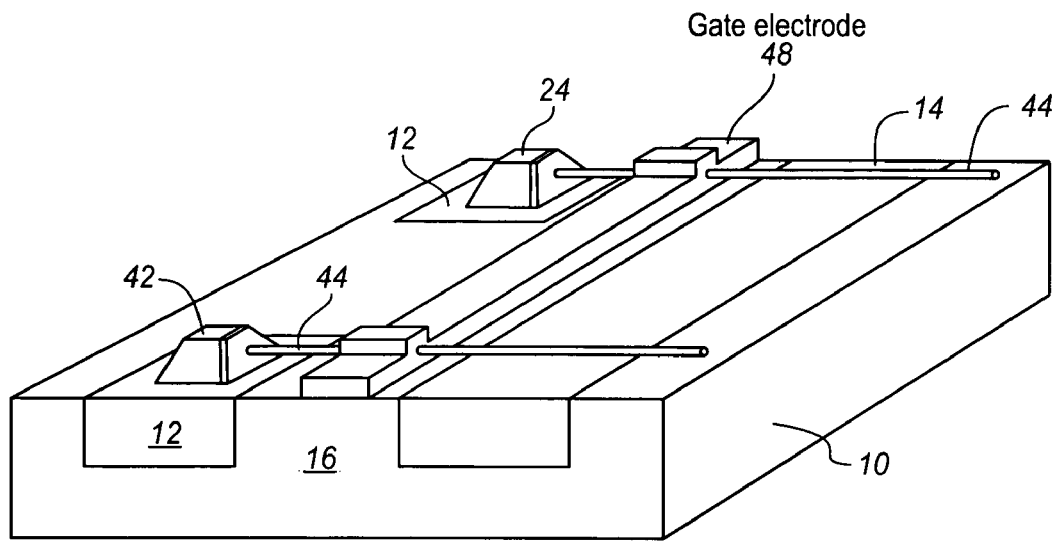
FIG. 14 is a diagram of the portion of the silicon substrate showing gate electrodes formed according to an embodiment of the invention.
Figure 15:
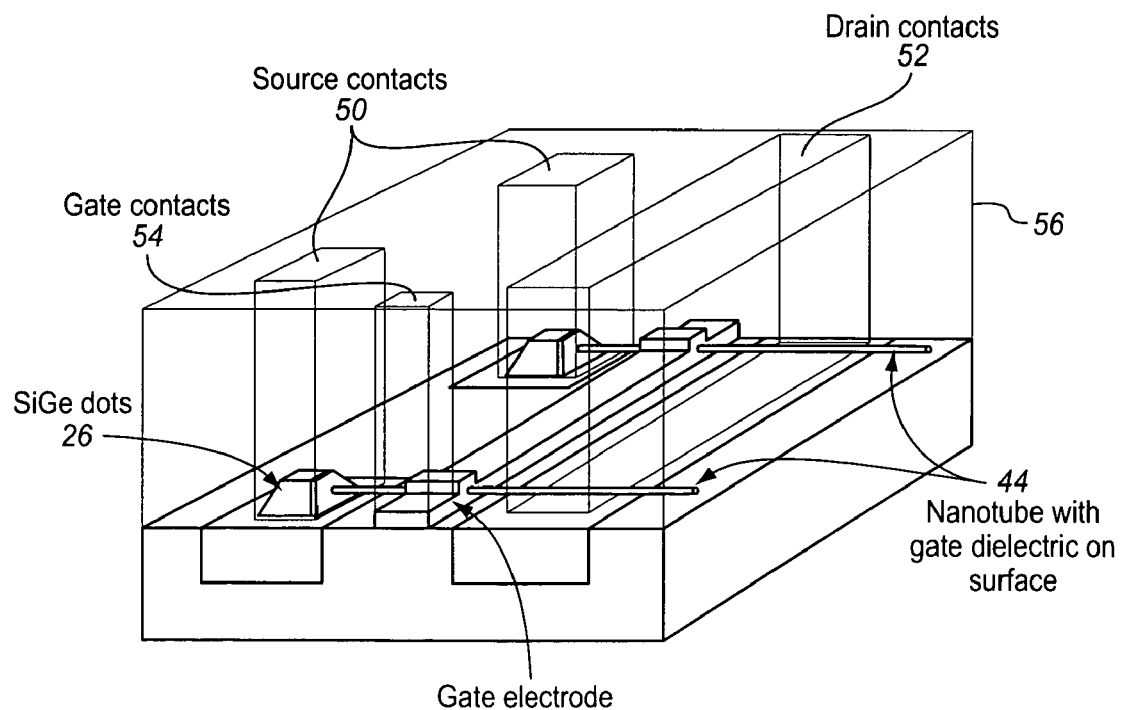
FIG. 15 is a diagram of the portion of the silicon substrate showing source and drain contacts and an ILDO formed according to an embodiment of the invention.

The direction of the growth is determined by the angle of the facet upon which the nanotube is grown. In the example of FIG. 11, the facet is at a 25° angle and so the nanotube 44 extends outward at this angle. The nanotubes may be grown to any desired length. In FIGS. 11, 12, and 13, a portion of a nanotube is shown. FIGS. 14 and 15 show that the nanotubes are extended much further and extend out across the isolation area 16 and across the drain area 14. The length of the nanotubes may be controlled by growth processes including time, temperature gas flows and pressures.

In FIG. 12, the growth inhibiting dopant layer 42 is removed using, for example a wet or dry etch process.

In FIG. 13, a layer 46 of gate dielectric, such as SiO or $SiN_3$ or high dielectric constant dielectrics are deposited over the substrate 10 including the carbon nanotubes 44 using sputtering, CVD (chemical vapor deposition) or ALD (atomic layer deposition) techniques.

In FIG. 14, with the insulated carbon nanotubes 44, 46 in place, the rest of the transistor structure may be formed. Gate electrodes 48 may be formed using, for example metal deposition, photolithography and etch processing. The gate electrodes may be Cu, Au, Al, carbon fiber or a variety of other materials. As can be seen in FIG. 14, a pair of transistors is now formed with the sources 12 and the shared drain 14 and electrodes 48 to provide a connection for the transistors.

In FIG. 15, source contacts 50, drain contacts 52, and gate contacts 54 may be formed using metallization and lithography processing. These are formed to make an electrical connection with the electrodes 48 and thereby with the carbon nanotubes 44. ILDO (inter-level dielectric) 56, capping and other layers may be formed over the contacts as may be appropriate for the particular device. Further layers of carbon nanotubes and nanotubes-based or other transistors may also be formed over the FIG. 14 structure depending on the particular device.

In the illustrated example, the transistors are formed by forming a wetting layer over the source regions, then applying a catalytic layer over the wetting layer and growing the carbon nanotubes from the source areas to the drain area. However, the wetting and catalytic layers may instead be formed on the drain region and then carbon nanotubes may be grown from the drain region to the source region. The starting point for the nanotubes may be selected based on the desired structure for the transistors, among other considerations.

Devices formed according to different embodiments of the present invention may be used in a wide range of different circuits. An application of embodiments of the present invention is in forming transistors for use in VLSI (Very Large Scale Integrated Circuits) that may be used in controllers, processors, hubs, DSPs (Digital Signal Processors), ASICs (Application Specific Integrated Circuit), memories and many other devices. However, the well-controlled carbon nanotubes structures may also be used in many other applications.

A lesser or more complex semiconductor device, nanotube structure, catalytical island, dopants and doped layers, than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. A method comprising:
   forming a self-assembled catalytic dot having a plurality of facets on a substrate for a microelectronic device;
   growing a carbon nanotube on one of the facets of the dot to extend therefrom,
   wherein the dot is doped to have a growth promoting layer on the facet on which the nanotube is grown and is doped to have a growth inhibiting layer on the others of the plurality of facets.

2. The method of claim 1, further comprising applying a growth inhibiting dopant to a facet of the dot using an angled implant and wherein growing comprises growing the carbon nanotube on a facet other than the inhibiting dopant-doped facet of the dot.

3. The method of claim 1, wherein forming comprises forming a self-assembled Ge dot.

4. The method of claim 1, wherein forming a faceted dot comprises depositing a wetting layer onto a portion of the substrate, depositing a catalytic layer over the wetting layer, and annealing the wetting and catalytic layers.

5. The method of claim 1 wherein:
   forming comprises forming a self-assembled catalytic layer having a desired position and orientation on a substrate for a microelectronic device; and wherein the carbon nanotube has a form defined in part by the position and orientation of the catalytic layer.

6. The method of claim 5, wherein forming comprises doping the catalytic layer with a growth promoting material in a position at which the carbon nanotubes will be grown.

7. The method of claim 6, wherein doping comprises implanting the dopant at an angle that limits the dopant to locations at which carbon nanotubes are desired.

8. The method of claim 6, wherein doping comprises implanting a dopant with a low energy and a high dose.

9. The method of claim 5, wherein forming comprises doping with a growth inhibiting dopant across the surface of the substrate and then doping a selected portion of the catalytic layer with a growth promoting dopant.

10. The method of claim 5, wherein forming comprises forming over a source area, and wherein growing comprises growing from the source area to a drain area, the method further comprising forming contacts to the source and drain areas to form a transistor.

11. The method of claim 5, further comprising coating the carbon nanotubes with a gate dielectric.

12. The method of claim 5, wherein forming comprises forming a raised surface having angled facets, the method further comprising applying a growth promoting dopant to a facet of the raised surface by implanting a dopant at an angle and direction that is directed toward the facet.

13. An apparatus comprising:
- a self-assembled, catalytic dot on a microelectronic substrate, the dot having a plurality of facets; and
- a carbon nanotube coupled to one of the plurality of facets and extending therefrom,
- wherein the dot is doped to have a growth promoting layer on the facet to which the nanotube is coupled and is doped to have a growth inhibiting layer on the others of the plurality of facets.

14. The apparatus of claim 13, further comprising a transistor electrode on the substrate coupled to the dot.

15. The apparatus of claim 13, further comprising a second transistor electrode on the substrate and wherein the nanotube is coupled to the second transistor electrode at an end opposite the dot.

16. The apparatus of claim 13, further comprising a gate dielectric surrounding the carbon nanotube.

17. The apparatus of claim 13, wherein the faceted dot comprises Ge and wherein the facets are aligned to axes of the dot's crystalline structure, and the facets are aligned to the substrate on which the dots are formed through annealing so that the carbon nanotube extends in direction aligned to the substrate.

18. The apparatus of claim 17, the facet coupled to the carbon nanotube has a multilayer wetting cladding layer annealed to self-assemble the dot, wherein the wetting layer comprises deposited Ge and the cladding layer comprises a catalytic metal.

* * * * *

UNITED STATES PATENT AND TRADEMARK OFFICE
CERTIFICATE OF CORRECTION

| | | |
|---|---|---|
| PATENT NO. | : 7,638,383 B2 | Page 1 of 1 |
| APPLICATION NO. | : 11/524067 | |
| DATED | : December 29, 2009 | |
| INVENTOR(S) | : Jin et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 446 days.

Signed and Sealed this

Twenty-first Day of December, 2010

David J. Kappos
*Director of the United States Patent and Trademark Office*